United States Patent
Li et al.

(10) Patent No.: US 8,093,600 B2
(45) Date of Patent: Jan. 10, 2012

(54) LED PACKAGING STRUCTURE

(75) Inventors: Hsiao-Chiao Li, Sinjhuant (TW); Yi-Tsuo Wu, Jhonghe (TW)

(73) Assignee: Everlight Electronics Co., Ltd., Tu Chen (TW)

( * ) Notice: Subject to any disclaimer, the term of this patent is extended or adjusted under 35 U.S.C. 154(b) by 0 days.

(21) Appl. No.: 12/615,963

(22) Filed: Nov. 10, 2009

(65) Prior Publication Data

US 2010/0052001 A1    Mar. 4, 2010

Related U.S. Application Data

(63) Continuation of application No. 11/878,252, filed on Jul. 23, 2007, now Pat. No. 7,635,870.

(30) Foreign Application Priority Data

Jul. 24, 2006    (TW) ................................ 95126989 A

(51) Int. Cl.
*H01L 27/15* (2006.01)
*H01L 31/12* (2006.01)
*H01L 33/00* (2010.01)

(52) U.S. Cl. .............. 257/79; 257/98; 257/E33.001

(58) Field of Classification Search .............. 257/79, 257/81, 89, 98, E33.001, E33.061
See application file for complete search history.

(56) References Cited

U.S. PATENT DOCUMENTS

| | | | |
|---|---|---|---|
| 6,513,949 B1 | 2/2003 | Marshall et al. | |
| 6,805,600 B2 | 10/2004 | Wang et al. | |
| 7,005,679 B2 | 2/2006 | Tarsa et al. | |
| 2002/0047624 A1* | 4/2002 | Stam et al. | 315/291 |
| 2007/0243645 A1* | 10/2007 | Lin et al. | 438/26 |
| 2008/0048193 A1 | 2/2008 | Yoo et al. | |
| 2009/0039762 A1* | 2/2009 | Park et al. | 313/502 |

FOREIGN PATENT DOCUMENTS

| | | |
|---|---|---|
| CN | 1617361 A | 5/2005 |
| CN | 1630107 | 6/2005 |
| CN | 1783521 | 6/2006 |
| JP | 11039917 A | 2/1999 |
| JP | 2003-017753 A | 1/2003 |
| JP | 2005-5482 | 1/2005 |
| JP | 2005-252082 A | 9/2005 |
| TW | 595019 | 6/2004 |
| TW | I260799 | 8/2006 |
| WO | WO-2005/112137 A1 | 11/2005 |

OTHER PUBLICATIONS

Japanese Office Action, dated May 26, 2011, in a counterpart Japanese patent application, No. JP2007-171813.

* cited by examiner

*Primary Examiner* — Hoai V Pham
(74) *Attorney, Agent, or Firm* — Chen Yoshimura LLP

(57) ABSTRACT

A light emitting diode packaging structure includes a package body, a red LED chip, a blue LED chip, a green LED chip, a package material and a yellow phosphor. Three LED chips are disposed within an accommodating room of the body package and covered by the package material. The yellow phosphor is uniformly mixed with the package material. A white light is formed by a mix of three types of light from the LED chips. Additionally, a yellow light which is generated from the excitement of the yellow phosphor with the blue light is mixed with a part of the blue light to further form the white light.

18 Claims, 3 Drawing Sheets

LED PACKAGING STRUCTURE

RELATED APPLICATIONS

This is a Continuation Application of U.S. application Ser. No. 11/878,252, filed on Jul. 23, 2007, now U.S. Pat. No. 7,635,870 which claims priority to Taiwan Application Serial Number 95126989, filed Jul. 24, 2006, all of which are herein incorporated by reference.

FIELD OF THE INVENTION

The present invention generally relates to a light emitting diode packaging structure. More particularly, this invention relates to a light emitting diode packaging structure to improve the color rendering property thereof.

BACKGROUND OF THE INVENTION

Semiconductor light emitting diode (LED) has become a promising device for general-purpose illumination applications. LEDs features include, excellent durability, long operation life, low power consumption, containing no mercury and potentially high efficiency. White LED is an illumination light source that is good for environmental protection and energy saving. Recently, LEDs are progressively being used in the illumination field for the electronic devices. For example, LEDs are popularly used in the mobile phones, personal digital assistants (PDAs) and so on.

Currently, the white LED adopts a red LED chip, a green LED chip and a blue LED chip to pack together in a packing structure so as to mix the three colors to form the white light.

Additionally, the color rendering index (Ra) is a measure of the ability of a light source to reproduce the colors of various objects being lit by the source. A high color rendering index light source can provide a better color representation for the object, that is, close to the natural color thereof. However, the color rendering index of a conventional LED is very poor. For example, the color rendering index of the conventional LED with red, blue and green LED chips is about 60~70. Therefore, there is a need to improve the color rendering index for the LED illumination device.

SUMMARY OF THE INVENTION

One object of the present invention is to provide a light emitting diode packaging structure to improve the color rendering index for the light emitting diode with three fundamental color chips.

Another object of the present invention is to provide a light emitting diode packaging structure, by simple packing processes, to improve the color rendering index of the light emitting diode.

Further, another object of the present invention is to provide a light emitting diode packaging structure to reduce the driving current for the green LED chip to further uniform the driving currents of the three fundamental color LED chips.

To achieve these and other advantages and in accordance with the purpose of the present invention, as the embodiment broadly describes herein, the present invention provides a light emitting diode (LED) packaging structure. The LED packaging structure includes a package body having an accommodating room, an LED chipset, a package material, and a phosphor mixed in the packing material. The LED chipset is disposed in the accommodating room and includes a first LED chip to generate a green light having a wavelength about 510 nm to 550 nm, a second LED chip to generate a blue light having a wavelength about 440 nm to 480 nm, and a third LED chip to generate a red light having a wavelength about 600 nm to 630 nm.

The package material is filled in the accommodating room to protect the LED chipset. Additionally, phosphor powder is mixed with the packing material and able to generate a light with a wavelength about 560 nm to 600 nm.

When the driving current is supplied through the electrode leads to the LED chips, a part of the blue light can excite the phosphor to generate a yellow light to mix with the blue light to form an additional white light while the green light, the blue light and the red light are mixed to form the white light.

Accordingly, the illumination device with the LED packaging structure according to the present invention can effectively improve the color rendering index and the luminous efficiency thereof. Additionally, the driving current of the LED chips are more consistent due to the reduced green light requirement and the increased blue light requirement.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1A:
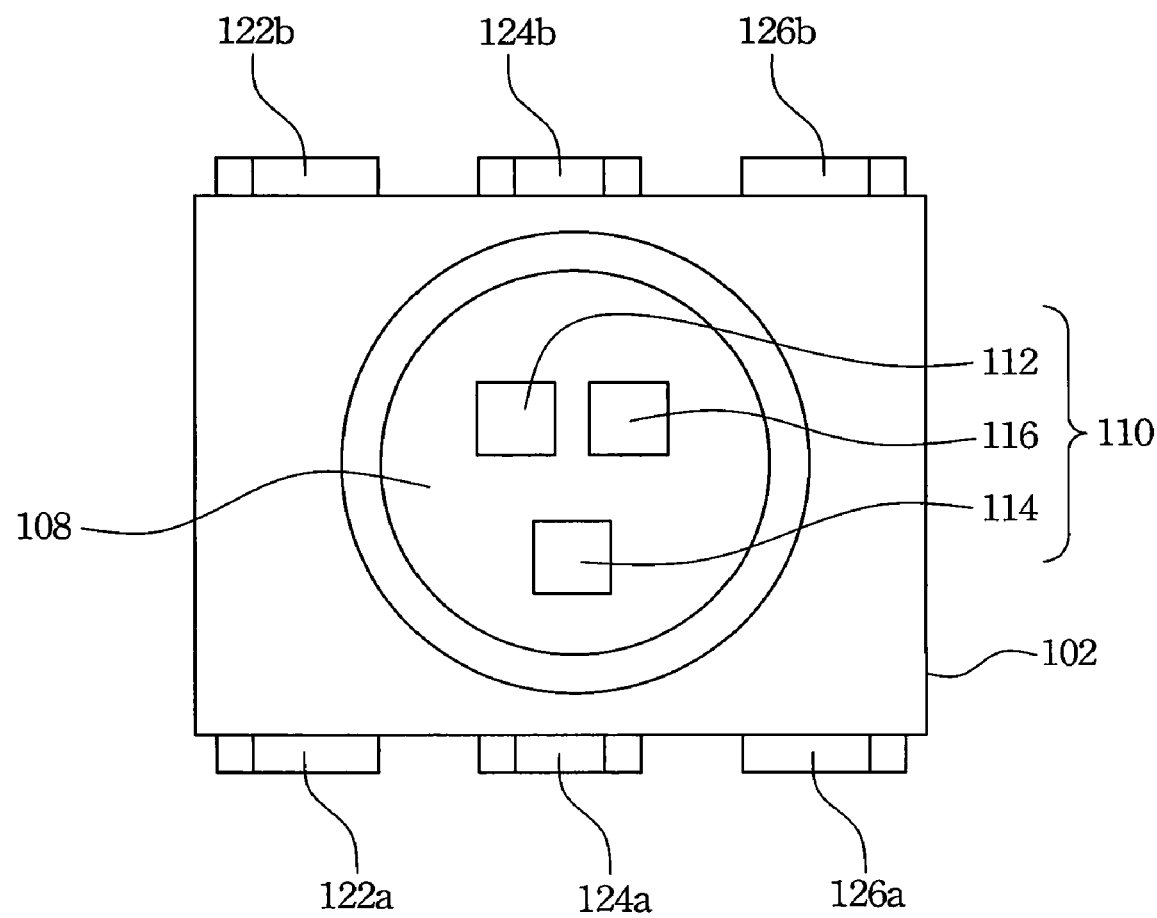
FIG. 1A illustrates a top view of a preferred embodiment of the light emitting diode packaging structure according to the present invention.
Figure 1B:
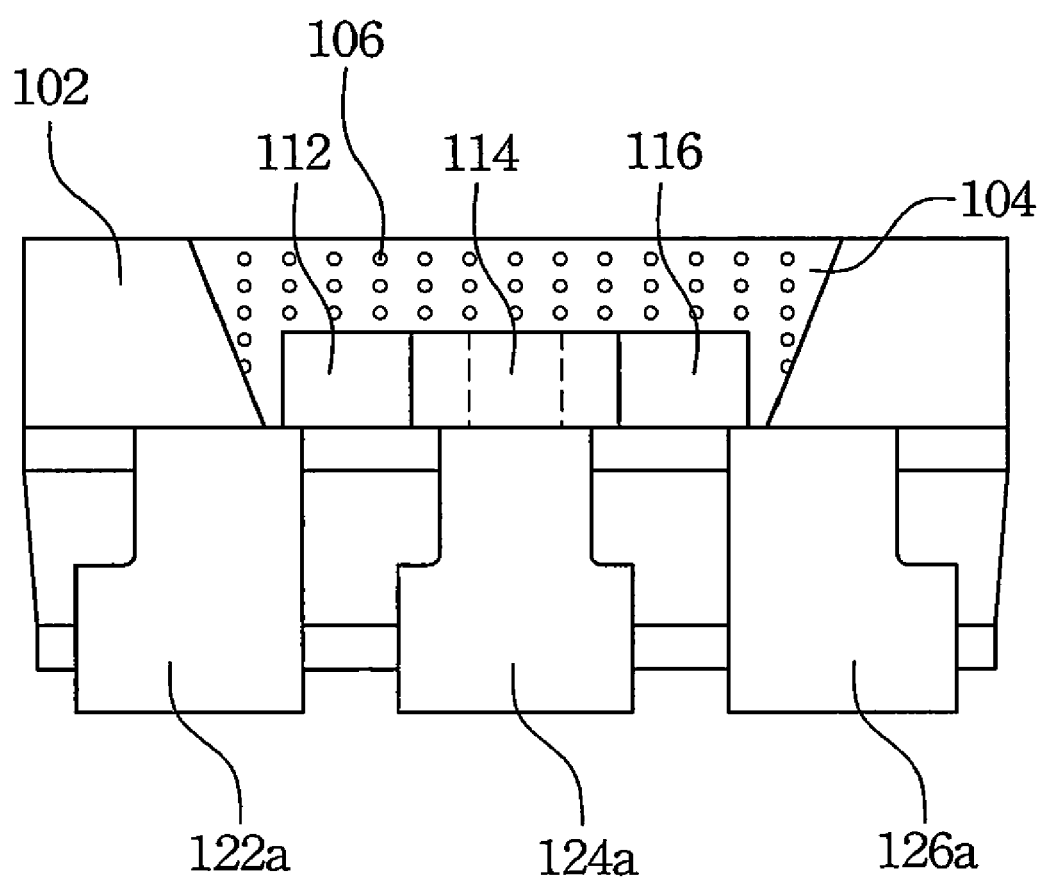
FIG. 1B illustrates a side view of the preferred embodiment of the light emitting diode packaging structure of FIG. 1A.

Referring to FIGS. 1A and 1B, a top view and a side view of a preferred embodiment of the light emitting diode packaging structure according to the present invention are respectively illustrated. Additionally, the package material 104 is omitted from FIG. 1A to clearly present the accommodating room 108.

In one embodiment, the light emitting diode packaging structure includes a package body 102, an LED chipset 110, a package material 104, a phosphor 106 and electrode leads.

The package body 102 is injected and formed by the materials of polyphthalamide (PPA), epoxy resin, glass fiber, calcium oxide and so on. The package body 102 includes an accommodating room 108 to accommodate the LED chipset 110.

The LED chipset 110 includes a first LED chip 112, a second LED chip 116 and a third LED chip 114. The first LED chip 112 can output a light with the wavelength about 510 nm to 550 nm, for example, a green light LED chip. The second LED chip 116 can output a light with the wavelength about 440 nm to 480 nm, for example, a blue light LED chip.

Additionally, the third LED chip 114 can output a light with the wavelength about 600 nm to 630 nm, for example, a red light LED chip.

The package material 104 is filled in the accommodating room 108 to cover and protect the LED chipset 110 and allows the light emitting therefrom. The package material 104 is, for example, epoxy resin, acrylic resin, silicone or the combination thereof.

The phosphor 106, for example, yellow phosphor, is uniformly mixed in the package material 104 and emits the light with the spectrum of radiation at about 560 nm to 600 nm peak wavelength while the phosphor 106 is excited. Three fundamental LED chips can provide RGB lights to mix and form the white light. The second LED chip 116 can excite the phosphor 106 to emit an excited light which can mix with the blue light generated by the second LED chip 116 to form a white light.

The electrode leads include the positive electrode leads 122a, 124a, 126a electrically connected to the positive electrodes of the LED chips and the negative electrode leads 122b, 124b, 126b electrically connected to the negative electrodes of the LED chips.

When the electrical power is supplied through the positive electrode leads and the negative electrode leads to the corresponding LED chips, the LED chips generate corresponding lights. The blue light LED chip 116 generates the blue light and a part of the blue light can excite the yellow phosphor 106 to emit yellow light so that another part of the blue light can mix with the yellow light to further form the additional white light. The residual blue light is mixed with the green light and the red light to form the white light.

Figure 2:
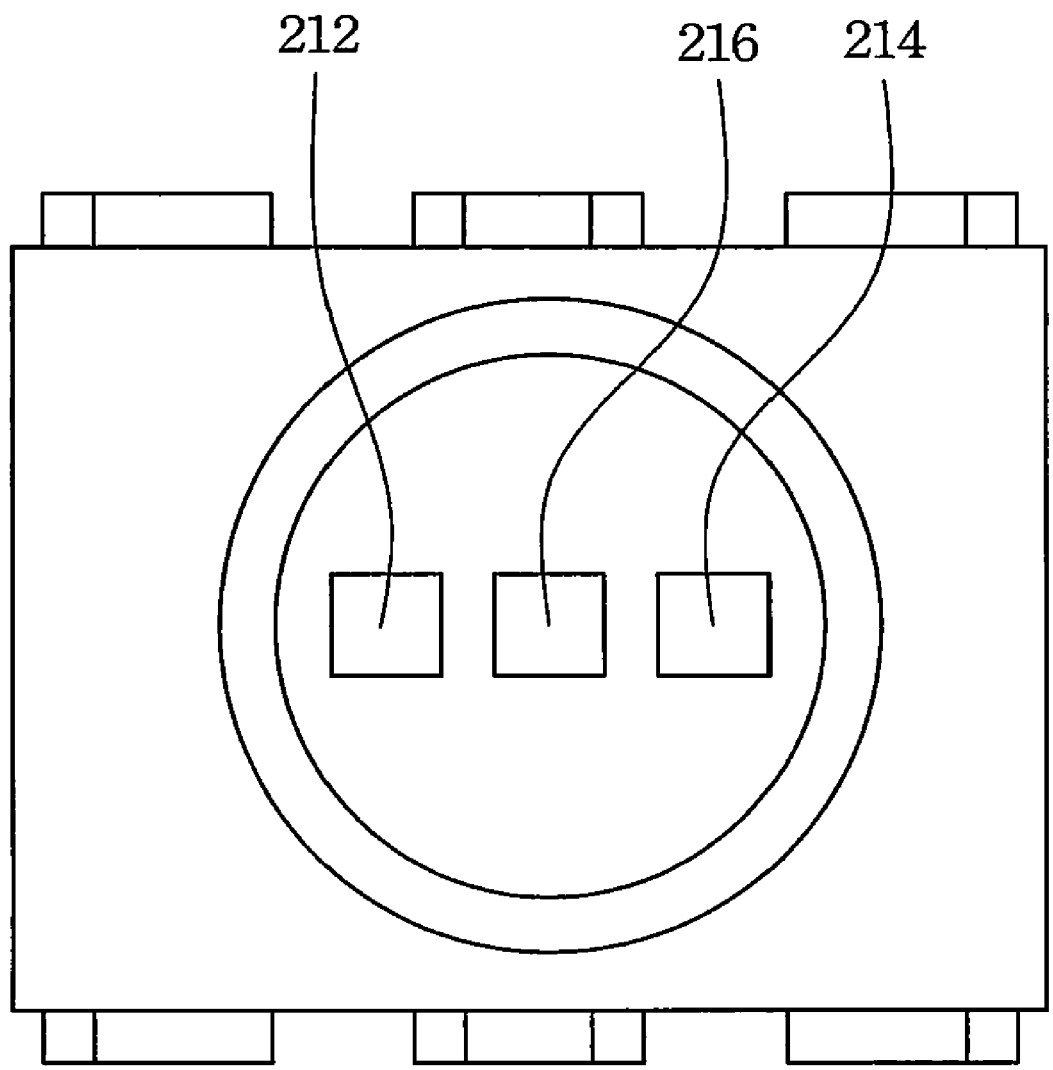
FIG. 2 illustrates another preferred embodiment of the light emitting diode packaging structure according to the present invention.

In the embodiment, the three LED chips are triangularly arranged. In other embodiments, the three LED chips can be in various arrangements. Referring to FIG. 2, another preferred embodiment of the light emitting diode packaging structure according to the present invention is illustrated. The first LED chip 212, the third LED chip 214 and the second LED chip 216 are linearly arranged. Additionally, the second LED chip 216 is disposed in the middle position to excite the phosphor easily.

A yellow color light is excited to further mix into the white light mixed by the fundamental color lights generated by the RGB LED chips so as to effectively improve the white light closer to the sunlight and increase the color rendering index thereof. Additionally, the blue light can efficiently mix with the light with 560 nm to 600 nm wavelength to form the additional white light.

Additionally, the brightness ratio of a conventional RGB LED chipset in the backlight module is about 3:6:1. Therefore, the driving current has to over drive the green light LED chip to generate more green light. However, the driving current for the blue light LED chip has to down drive the blue light LED chip to generate insufficient blue light. Therefore, the driving currents for the RGB LED chips are inconsistent.

The present invention adds the additional yellow phosphor in the package material of the light emitting diode to spend the blue light so as to the driving current for the blue LED chip is increased. Additionally, the blue light can mix with the yellow light to form additional white light so as to reduce the requirement of the green light and the driving current for the green LED chip. Accordingly, the driving currents for the RGB LED chips are more consistent. The mixed ratio of the phosphor can determine the final brightness of the LED and the purity of the white light so that a person skilled in the art can adjust the mixed ratio of the phosphor according to the actual requirement of the LED without departing from the scope and spirit of the present invention.

Compared with the conventional RGB LED illumination device, the present invention can improve the color rendering index for an illumination device, for example, a backlight module, with the LED packaging structure according to the present invention to represent actual colors on the object. The luminous efficiency of the illumination device can also be improved since that the blue light and the yellow light can mix to form the additional white light.

The LED packaging structure, according to the present invention, has no additional equipment requirement. There is only mixing the package material with phosphor, able to generate 560 nm to 600 nm light, and molding the LED chips in the accommodating room with the package material mixing with the phosphor. Additionally, the blue light can effectively mix with the yellow light to form the white light in a high transformation efficiency. Furthermore, the driving currents of the RGB LED chips are more consistent.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A light emitting diode (LED) packaging structure, comprising:
   a substrate;
   an LED chipset disposed on the substrate, the LED chipset at least having a first LED chip to generate a green light and having a second LED chip to generate a blue light, where each of the first and second LED chips has a positive electrode and a negative electrode;
   at least two positive electrode leads disposed on the substrate and electrically connected to the positive electrodes of the first and second LED chips respectively,
   at least two negative electrode leads disposed on the substrate and electrically connected to the negative electrodes of the first and second LED chips respectively,
   wherein the at least two positive electrode leads are disposed on a side of the substrate, and the at least two negative electrode leads are disposed on an opposite side of the substrate;
   a package material covering the LED chipset; and
   a phosphor uniformly mixed in the package material, converting a portion of the blue light to a yellow light,
   wherein the yellow light and the remaining blue light are mixed to form a white light.

2. The light emitting diode (LED) packaging structure of claim 1, wherein the LED chipset further comprises a third LED chip to generate a red light.

3. The light emitting diode (LED) packaging structure of claim 2, wherein the three LED chips are arranged in a linear sequence or in triangle.

4. The light emitting diode (LED) packaging structure of claim 3, wherein the package material is epoxy resin, acrylic resin, silicone or combinations thereof.

5. The light emitting diode (LED) packaging structure of claim 2, wherein the package material is epoxy resin, acrylic resin, silicone or combinations thereof.

6. The light emitting diode (LED) packaging structure of claim 1, wherein the package material is epoxy resin, acrylic resin, silicone or combinations thereof.

7. A light emitting diode (LED) packaging structure, comprising:
   a substrate;

an LED chipset disposed on the substrate, the LED chipset at least having a first LED chip to generate a green light, a second LED chip to generate a blue light and a third LED chip to generate a red light, where each LED chip has a positive electrode and a negative electrode;

at least three positive electrode leads disposed on the substrate and electrically connected to the positive electrodes of the first, second and third LED chips respectively;

at least three negative electrode leads disposed on the substrate and electrically connected to the negative electrodes of the first, second and third LED chips respectively, wherein the at least three positive electrode leads are disposed on a side of the substrate, and the at least three negative electrode leads are disposed on an opposite side of the substrate;

a package material covering the LED chipset; and a phosphor uniformly mixed in the package material, converting a portion of the blue light to a yellow light, where the yellow light has a wavelength range about from 560 nm to 600 nm;

wherein the yellow light and the remaining blue light are mixed to form a white light.

8. The light emitting diode (LED) packaging structure of claim 7, wherein the three LED chips are arranged in a linear sequence or in triangle.

9. The light emitting diode (LED) packaging structure of claim 8, wherein the package material is epoxy resin, acrylic resin, silicone or combinations thereof.

10. The light emitting diode (LED) packaging structure of claim 7, wherein the package material is epoxy resin, acrylic resin, silicone or combinations thereof.

11. The light emitting diode (LED) packaging structure of claim 7, wherein the LED chipset further comprises a third LED chip to generate a red light.

12. The light emitting diode (LED) packaging structure of claim 11, wherein the three LED chips are arranged in a linear sequence or in triangle.

13. The light emitting diode (LED) packaging structure of claim 12, wherein the package material is epoxy resin, acrylic resin, silicone or combinations thereof.

14. The light emitting diode (LED) packaging structure of claim 11, wherein the package material is epoxy resin, acrylic resin, silicone or combinations thereof.

15. A light emitting diode (LED) packaging structure, comprising:

a substrate;

an LED chipset disposed on the substrate, the LED chipset at least having a first LED chip to generate a green light in a wavelength range about from 510 nm to 550 nm and having a second LED chip to generate a blue light in a wavelength range about from 440 nm to 480 nm, where each LED chip has a positive electrode and a negative electrode;

at least two positive electrode leads disposed on the substrate and electrically connected to the positive electrodes of the first and second LED chips respectively;

at least two negative electrode leads disposed on the substrate and electrically connected to the negative electrodes of the first and second LED chips respectively, wherein the at least two positive electrode leads are disposed on a side of the substrate, and the at least two negative electrode leads are disposed on an opposite side of the substrate;

a package material covering the LED chipset; and a phosphor uniformly mixed in the package material, converting a portion of the blue light to a yellow light, where the yellow light has a wavelength range about from 560 nm to 600 nm, wherein the yellow light and the remaining blue light are mixed to form a white light.

16. The light emitting diode (LED) packaging structure of claim 15, wherein the chipset further comprises a third LED chip to generate a red light, and the three LED chips are arranged in a linear sequence or in triangle.

17. The light emitting diode (LED) packaging structure of claim 16, wherein the package material is epoxy resin, acrylic resin, silicone or combinations thereof.

18. The light emitting diode (LED) packaging structure of claim 15, wherein the packag material is epoxy resin, acrylic resin, silicone or combinations thereof.

* * * * *